United States Patent
Yamada et al.

(10) Patent No.: US 12,149,053 B2
(45) Date of Patent: Nov. 19, 2024

(54) SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

(72) Inventors: Hitoshi Yamada, Nisshin (JP); Yuki Kamata, Nisshin (JP); Koichi Oyama, Nisshin (JP); Yutaka Ohnishi, Kawasaki (JP); Kenichi Nishi, Kawasaki (JP); Keizo Takemasa, Kawasaki (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

( * ) Notice: Subject to any disclaimer, the term of this patent is extended or adjusted under 35 U.S.C. 154(b) by 0 days.

(21) Appl. No.: 18/193,980

(22) Filed: Mar. 31, 2023

(65) Prior Publication Data

US 2023/0327406 A1 Oct. 12, 2023

(30) Foreign Application Priority Data

Apr. 11, 2022 (JP) ................. 2022-065332

(51) Int. Cl.
- *H01S 5/34* (2006.01)
- *C09K 11/74* (2006.01)
- *B82Y 20/00* (2011.01)

(52) U.S. Cl.
CPC ........ *H01S 5/3412* (2013.01); *C09K 11/7492* (2013.01); *B82Y 20/00* (2013.01)

(58) Field of Classification Search
CPC ...................................... B82Y 20/00
See application file for complete search history.

(56) References Cited

U.S. PATENT DOCUMENTS

2005/0169332 A1* 8/2005 Schwarz ................. H01S 5/341
372/39
2008/0308788 A1 12/2008 Ebe et al.

FOREIGN PATENT DOCUMENTS

| JP | 2006-060035 A | 3/2006 |
| JP | 2008-147290 A | 6/2008 |

OTHER PUBLICATIONS

Zhukov et al., "Gain Characteristics of Quantum Dot Injection Lasers," Semiconductor Science and Technology, 14, 118, 1999 (Year: 1999).*

* cited by examiner

*Primary Examiner* — Ian A Rummel
(74) *Attorney, Agent, or Firm* — Posz Law Group, PLC

(57) ABSTRACT

In a semiconductor device, a quantum dot group includes a stack of plural quantum dot layers having different central wavelengths at which respective gains are maximum. A part of or all of the quantum dot layers are stacked so that the central wavelengths sequentially shifts along a stacking direction. The quantum dot group includes a longest wavelength layer group composed of some quantum dot layers including a longest wavelength layer having a longest central wavelength and at least one quantum dot layer stacked on the longest wavelength layer. The longest wavelength layer or the longest wavelength layer group has a larger gain at the central wavelength than the gain at the central wavelength of each of the other quantum dot layers.

6 Claims, 10 Drawing Sheets

SEMICONDUCTOR DEVICE

CROSS REFERENCE TO RELATED APPLICATION

The present application claims the benefit of priority from Japanese Patent Application No. 2022-065332 filed on Apr. 11, 2022. The entire disclosures of the above application are incorporated herein by reference.

TECHNICAL FIELD

The present disclosure relates to a semiconductor device having quantum dots.

BACKGROUND

For example, a quantum dot semiconductor device having quantum dots has been proposed. The quantum dot semiconductor device is, for example, used for a semiconductor optical amplifier (SOA).

SUMMARY

The present disclosure describes a semiconductor device having quantum dots. According to an aspect of the present disclosure, in a semiconductor device, a quantum dot group includes a stack of plural quantum dot layers having different central wavelengths at which respective gains are maximum. A part of or all of the quantum dot layers are stacked so that the central wavelengths sequentially shifts along a stacking direction. The quantum dot group includes a longest wavelength layer group composed of some quantum dot layers including a longest wavelength layer having a longest central wavelength and at least one quantum dot layer stacked on the longest wavelength layer. The longest wavelength layer or the longest wavelength layer group has a larger gain at the central wavelength than the gain at the central wavelength of each of the other quantum dot layers.

BRIEF DESCRIPTION OF THE DRAWINGS

Objects, features and advantages of the present disclosure will become more apparent from the following detailed description made with reference to the accompanying drawings in which.

DETAILED DESCRIPTION

Figure 1:
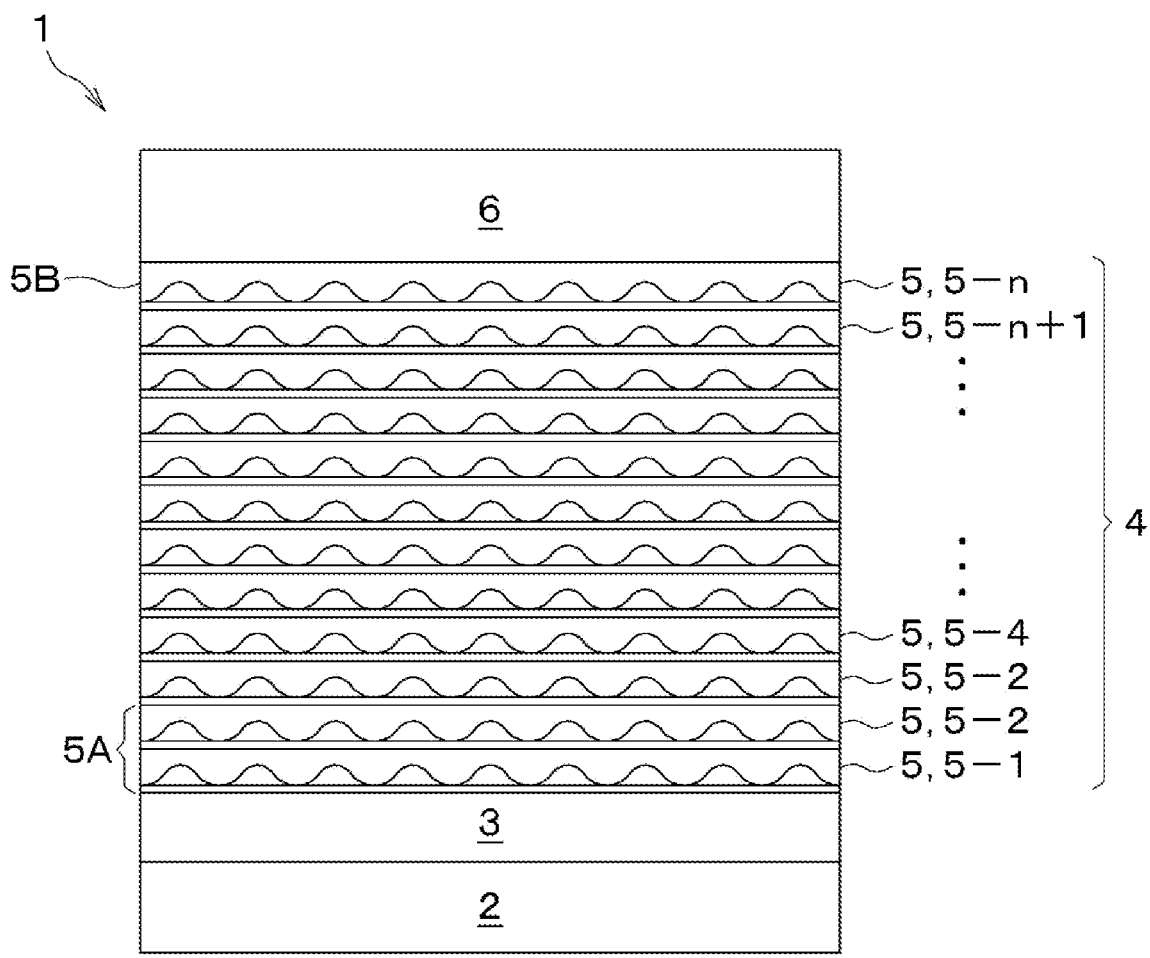
FIG. 1 is a cross-sectional view of a semiconductor device according to a first embodiment.

To begin with, a relevant technology will be described only for understanding the embodiments of the present disclosure.

For example, there has been proposed a quantum dot semiconductor device having quantum dots and used for a semiconductor optical amplifier (SOA) has been proposed. The quantum dot semiconductor device, for example, includes composite quantum dots composed of plural quantum dots stacked and side barrier layers disposed in contact with side faces of the composite quantum dots.

Such a semiconductor device is expected to be used in optical communication systems or the like. The number of stack of the quantum dots forming respective quantum dot layers and the magnitude of strain of the side barrier layer are set so as to have a flat gain bandwidth corresponding to the shift amount of the gain spectrum within a desired operation temperature range.

Such a semiconductor device is conceivable to be used for ranging sensors, such as Light Detection and Ranging (LiDAR) for vehicles. In this case, the semiconductor device of the SOA is arranged, for example, in the vicinity of a laser light source with a predetermined wavelength in the near-infrared range, and used to amplify the laser light from the laser light source.

As a ranging method by the LiDAR, for example, a time of flight (TOF) method, and a frequency modulated continuous wave (FMCW) method are known. The TOF method emits the light to the outside and calculates the distance to an external object based on the time period from a time point at which the light is emitted to the outside to a time point at which the reflected light reflected by the external object is received. The FMCW method continuously modulates the frequency of the laser light emitted to the outside, and calculates the distance based on the deviation of the frequency of the reflected light reflected by the external object. Hereinafter, the FMCW-type LiDAR is simply referred to as "FMCW-LiDAR" for the sake of simplification of explanation.

In the case of FMCW-LiDAR for the vehicle, the semiconductor element as the SOA is required to have a characteristic that achieves a constant gain over a wide wavelength band in a wide temperature range (e.g., −40 degrees Celsius (° C.) to 85° C.) of a vehicle environment. Quantum dots are known to have temperature robustness with small threshold changes even in such a wide temperature range. Therefore, in order to secure the gain in the wavelength band of the laser light to be used, it is considered to form the semiconductor device as the SOA using a plurality of groups of quantum dots with different operation wavelengths. In addition, the SOAs used for vehicles need to be used with the current injection having a predetermined value or higher because a large gain is required in the wavelength band to be used, as compared to the SOAs for the use of communication.

However, as a result of studies by the inventors of the present disclosure, it was found that, when the value of current injection is increased in order to secure the gain of a predetermined level or higher, there is a difference in the amount of increase in the gain between the short wavelength side and the long wavelength side in the wavelength band to be used, impairing the flatness of the gain. For example, in the semiconductor device described above, when the value of current injection is increased in order to achieve the gain of the predetermined level or higher, which is required for the use in vehicles, the increase in gain is larger on the short wavelength side than on the long wavelength side. As a result, it is difficult to secure the flatness of the gain.

The present disclosure provides a semiconductor device used as an SOA having quantum dots, which is capable of securing the flatness of gain in the wavelength band when used at the current injection of a predetermined value or higher.

According to an embodiment of the present disclosure, a semiconductor device includes a quantum dot group including a plurality of quantum dot layers stacked in a stacking direction. The plurality of quantum dot layers have different wavelengths at which respective gains are maximum. A part of or all of the plurality of quantum dot layers are stacked so that the wavelengths sequentially shift along the stacking direction. Of the plurality of quantum dot layers, the quantum dot layer having a longest wavelength, as the wavelength, is referred to as a longest wavelength layer, and the quantum dot layer having a shortest wavelength, as the wavelength, is referred to as a shortest wavelength layer. The quantum dot group includes a longest wavelength layer group composed of some quantum dot layers including the longest wavelength layer and at least one quantum dot layer stacked on the longest wavelength layer toward the shortest wavelength layer. The longest wavelength layer or the longest wavelength layer group has a larger gain at the wavelength than the gain at the wavelength of each of the other quantum dot layers.

The semiconductor device includes the quantum dot group composed of the plurality of quantum dot layers having different wavelengths at which the gain is maximum, and in which a part of or all of the quantum dot layers are stacked so that the wavelength is sequentially shifts. In the quantum dot group, the gain of the longest wavelength layer or some quantum dot layers including the longest wavelength layer is larger than the gain of each of the other quantum dot layers. That is, in the semiconductor device, the gain of the quantum dot layer the wavelength of which achieving the maximum gain is on the longest wavelength side is larger than the gain at the wavelength of the other quantum dot layers on the short wavelength side. Therefore, even when the semiconductor device is used with the current injection of the predetermined value or higher, it is less likely that the gain on the long wavelength side will be smaller than the gain on the short wavelength side in the whole of the quantum dot layers. Accordingly, the flatness of the gain can be secured.

Hereinafter, embodiments of the present disclosure will be described with reference to the drawings. In the following embodiments, the same or equivalent parts are denoted by the same reference numerals.

First Embodiment

A semiconductor device 1 according to a first embodiment will be described with reference to FIGS. 1 to 5.

[Basic Configuration]

As shown in FIG. 1, the semiconductor device 1 of the present embodiment, for example, includes a semiconductor substrate 2, an n-cladding layer 3, a quantum dot group 4, and a p-cladding layer 6. The semiconductor substrate 2, the n-cladding layer 3, the quantum dot group 4 and the p-cladding layer 6 are stacked on top of another in the stated order. The quantum dot group 4 includes a plurality of quantum dot layers 5 stacked on top of another. The semiconductor element 1 is preferably used to an SOA, which is, for example, used in an in-vehicle FMCW-LiDAR. However, the semiconductor element 1 can also be used for any other purposes.

The semiconductor substrate 2 is made of, for example, a semiconductor material such as n-type GaAs, and the n-cladding layer 3 is stacked on a (100) plane of the semiconductor substrate 2 as a lower cladding layer. The semiconductor substrate 2 has an electrode (not shown), for example, on a surface opposite to the n-cladding layer 3, so as to enable a voltage application to the quantum dot group 4.

The n-cladding layer 3 is made of, for example, a semiconductor material such as n-type AlGaAs, and is formed by any film formation method such as a molecular beam epitaxy (MBE) method.

The quantum dot group 4 serves as an active layer made of the stack of plural quantum dot layers 5.

Hereinafter, for convenience of explanation, as shown in FIG. 1, the total number of the plural quantum dot layers 5 is defined as "n", which is an integer greater than 0, and a quantum dot layer 5 that is closest to the semiconductor substrate 2 among the plural quantum dot layers 5 is referred to as the "first layer 5-1". Further, along a stacking direction of the plural quantum dot layers 5, e.g., along an upward direction in FIG. 1, the quantum dot layers 5 above the first layer 5-1 are referred to as "second layer 5-2", "third layer 5-3", "fourth layer 5-4", . . . and "n-th layer 5-$n$". Furthermore, the side of the quantum dot group 4 adjacent to the semiconductor substrate 2 in a direction along the stacking direction of the plural quantum dot layers 5 is defined as a "lower side", and an opposite side adjacent to the p-cladding layer 6 is defined as an "upper side". Thus, a quantum dot layer 5 disposed lower than another quantum dot layer 5 may be referred to as a "lower layer". Likewise, a quantum dot layer 5 disposed higher than another quantum dot layer 5 may be referred to as an "upper layer".

The quantum dot group 4 has a configuration in which a central wavelength that achieves the maximum gain of the quantum dots shifts sequentially to a short wavelength side in the stacking direction from the first layer 5-1 toward the n-th layer 5-$n$. Hereinafter, among the plural quantum dot layers 5, the quantum dot layer 5 having the central wavelength that is the longest in those of the plural quantum dot layers 5 is referred to as a "longest wavelength layer 5A", and the quantum dot layer 5 having the central wavelength that is the shortest in those of the plural quantum dot layers 5 is referred to as a "shortest wavelength layer 5B". In the quantum dot group 4 of the present embodiment, among the plural quantum dot layers 5, the end layer on the n-cladding layer 3 side is the longest wavelength layer 5A, and the end layer on the p-cladding layer 6 side is the shortest wavelength layer 5B. That is, in the present embodiment, the quantum dot group 4 has the configuration in which the central wavelength of the quantum dots shifts to the short wavelength side toward the upper layer. In other words, the upper layer has the shorter central wavelength.

Note that, the "long wavelength" and the "short wavelength" of the center wavelength of the quantum dot layer 5 are relative terms. For example, in the case where the semiconductor device 1 is used for the SOA of the in-vehicle FMCW-LiDAR, the central wavelength of the longest wavelength layer 5A is set in a range of 1250 nanometers (nm) to 1600 nm, and the central wavelength of the shortest wavelength layer 5B is set in a range of 1100 nm to 1450 nm. However, these are examples, and the central wavelengths are not particularly limited to these ranges.

The quantum dot group 4 is formed by repeating the formation of the quantum dot layer 5 having quantum dots. Although not limited, the quantum dot group 4 is formed by repeatedly stacking the quantum dot layers 5 with the thickness of ten and several nanometers to several tens of nanometers.

In the quantum dot group 4 of the present embodiment, multiple quantum dot layers 5 including the longest wavelength layer 5A and at least one quantum dot layer 5 disposed above the longest wavelength layer 5A on the shortest wavelength layer 5B side are referred to as a "longest wavelength layer group". In the quantum dot group 4, the quantum dot layers 5, excluding the quantum dot layers 5 belonging to the longest wavelength layer group, have different central wavelengths from each other.

For example, in the quantum dot group 4, the quantum dots of the quantum dot layers 5 of the longest wavelength layer group are made of InAs, and the quantum dots of the other quantum dot layers 5 are made of $In_xGa_{(1-x)}As$ ($0<x<1$), so that the other quantum dot layers 5, excluding the quantum dot layers 5 of the longest wavelength layer group, can have different emission wavelengths from each other. The quantum dot group 4 is configured such that the quantum dots of the other quantum dot layers 5, excluding the quantum dot layers 5 of the longest wavelength layer group, have different compositions or lattice constants between the other quantum dot layers 5, so that the emission wavelengths thereof shift sequentially. Note that the emission wavelength can be differentiated in each quantum dot layer 5 by conducting crystal-growth so as to generate strain, for example.

In the quantum dot group 4 of the present embodiment, all of the quantum dot layers 5 included in the longest wavelength layer group have the same central wavelength. In other words, in the quantum dot group 4, the total volume of quantum dots having the longest central wavelength is larger than the total volume of quantum dots in each different one of the other quantum dot layers 5. As a result, at a time of the high current injection, it is possible to obtain the gain of a predetermined level or higher in a wavelength band of the quantum dot group 4, that is, to obtain a high output, while securing the flatness of the gain spectrum. The details will be described later. The number of quantum dot layers 5 included in the longest wavelength layer group is set to two, or three or more. Further, the number of quantum dot layers 5 included in the longest wavelength layer group may be changed as appropriate.

The p-cladding layer 6 is made of, for example, a semiconductor material such as p-type AlGaAs. The p-cladding layer 6 is formed on the quantum dot group 4 by any film formation method such as a molecular beam epitaxy (MBE). An electrode (not shown) is formed on the surface of the p-cladding layer 6 opposite to the quantum dot group 4, and is paired with an electrode (not shown) formed on the semiconductor substrate 2. The pair of electrodes enables the voltage application to the quantum dot group 4.

The semiconductor device 1 of the present embodiment has the basic configuration as described hereinabove. In the semiconductor device 1, the height of the quantum dots of the quantum dot group 4 is sequentially changed along the stacking direction. In this case, the semiconductor element 1 obtains the gain of a predetermined level or higher in the wide wavelength band, while smoothing the gain at the time of the high current injection by having the longest wavelength layer group.

[Effects by Longest Wavelength Layer Group]

Next, the flatness of the gain spectrum by the longest wavelength layer group will be described with reference to the drawings.

First, issues in a semiconductor device of a comparative example will be described. The semiconductor device of the comparative example does not have the longest wavelength layer group. Namely, in the semiconductor device of the comparative example, all of the plural quantum dot layers 5 constituting the quantum dot group 4 have different central wavelengths of gain spectra. That is, the semiconductor device of the comparative example is different from the semiconductor device 1 of the first embodiment as it does not have the quantum dot layers 5 with the same central wavelength. The semiconductor device of the comparative example is configured such that the gain spectra of the plural quantum dot layers 5 overlap, so the gain in the wavelength band at the current injection value in the use for an optical communication system is smoothed, for example, as shown in FIG. 2.

Figure 2:
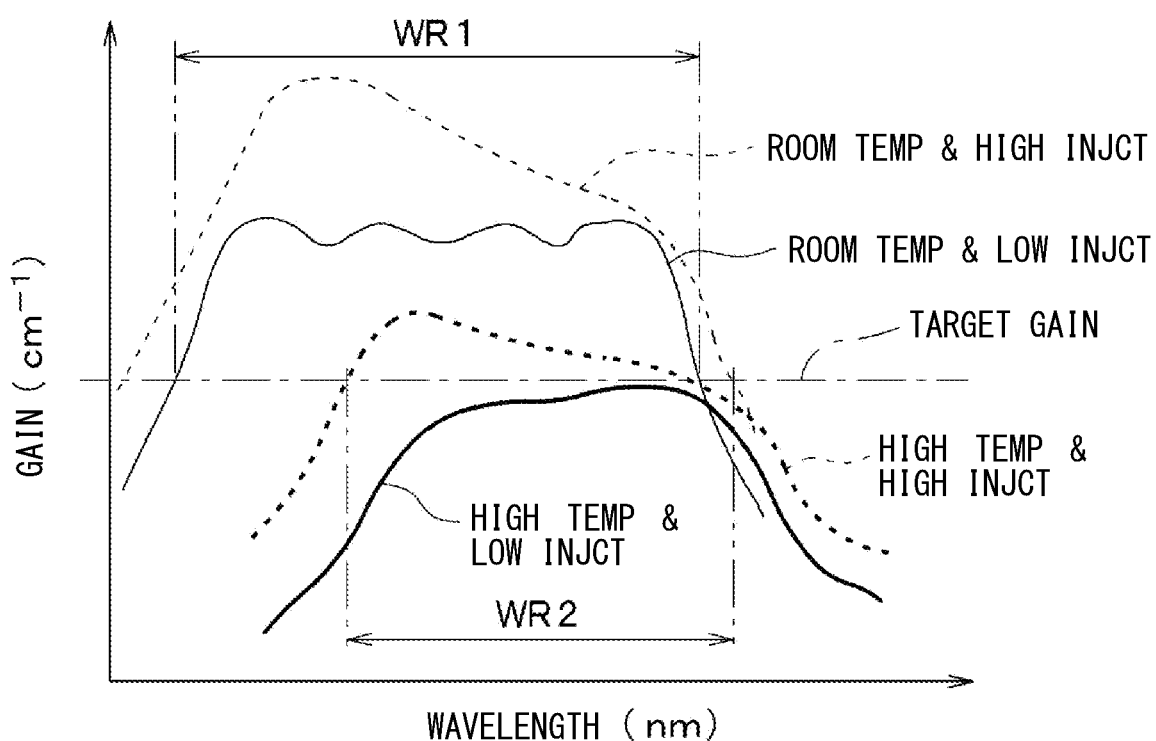
FIG. 2 is a diagram showing an example of changes in gain spectra with respect to different temperatures and current injection values in a semiconductor device of a comparative example.

In FIG. 2, "low injection" (LOW INJCT) means the current injection value assumed in the use for an optical communication system, and, for example, corresponds to a current value of less than 10 mA, and "high injection" (HIGH INJCT) means the current injection value assumed in the use for an in-vehicle LiDAR, and, for example, corresponds to a current value of 10 mA or higher. In this specification, "high injection" or "high current injection" means the current injection value in applications requiring high output such as in an in-vehicle LiDAR, and is, for example, 10 mA or higher, though not limited.

In the quantum dot SOA, when the temperature changes, the gain changes even if the current injection value is the same. The gain with respect to the current injection value and the wavelength band achieving the gain of the predetermined value or higher are different between the room temperature (e.g., 25° C.) and the high temperature (e.g., 85° C.). For example, in the semiconductor device of the comparative example, as shown in FIG. 2, the wavelength band in a case of the room temperature and the low injection is referred to as WR1, and the wavelength band in a case of the high temperature and the low injection is referred to as WR2. Thus, in the semiconductor device of the comparative example, the wavelength bands WR1 and WR2 satisfy a relation of WR1>WR2, and the gain of the WR1 in the case of the room temperature is higher than the gain of the WR2 in the case of the high temperature.

Therefore, in order to secure a desired gain of a predetermined level or more in the entire wavelength band, that is, to secure a target gain, it is conceivable to increase the current injection value so as to increase the gain of each quantum dot layer 5. However, as a result of studies by the inventors of the present disclosure, it was confirmed that, in the semiconductor device of the comparative example, as shown in FIG. 2, if the current injection value is high, the increase in gain on the short wavelength side is larger than the increase in gain on the long wavelength side in both of the case of the room temperature and the case of the high temperature. That is, it was confirmed that, in the semiconductor device of the comparative example, if the current injection value is increased, the smoothness of the gain spectrum is impaired in the wavelength bands WR1 and WR2.

Figure 3:
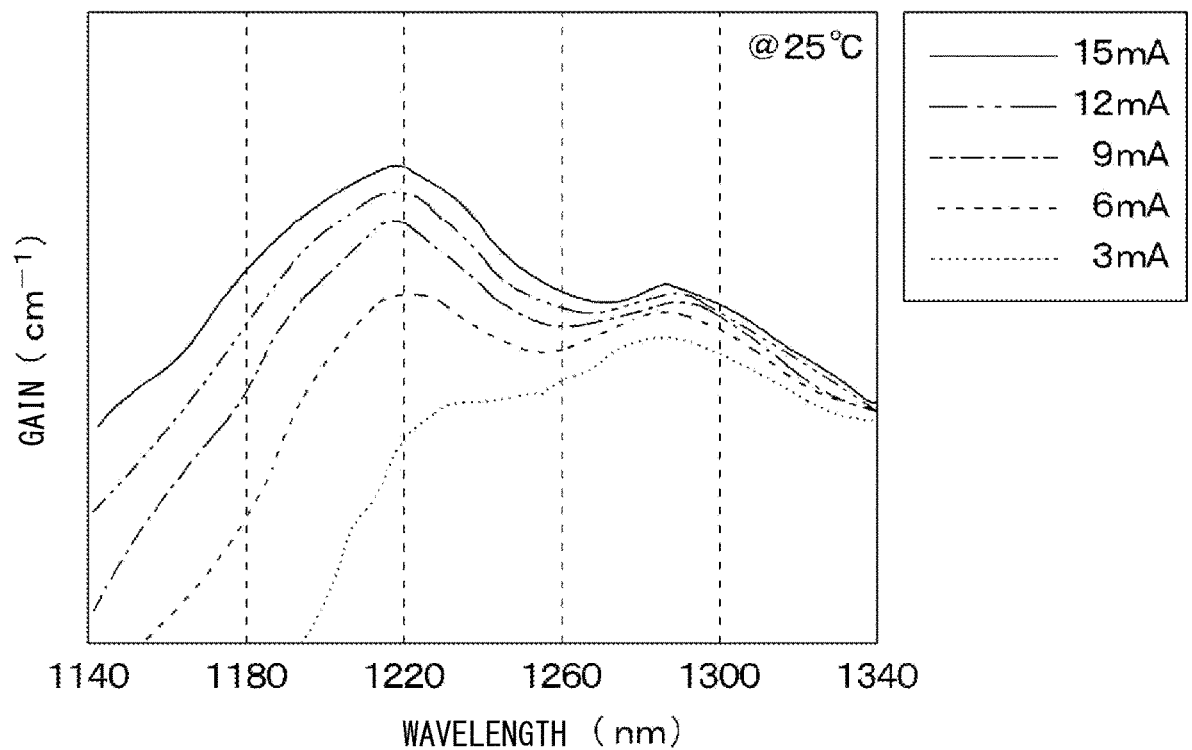
FIG. 3 is a graph showing changes in the gain spectra of the semiconductor device of the comparative example, when the current injection value is changed, at a room temperature.

Specifically, FIG. 3 shows the gains when the current injection value is changed in the range from 3 mA to 15 mA at 25° C. in the semiconductor device of the comparative example. As shown in FIG. 3, the gain largely increases at the wavelengths of 1220 nm and 1285 nm in each of the current injection values, but the magnitude of increase is significantly different depending on the current injection values. For example, when the current injection value is 3 mA, the gain at 1220 nm is smaller than the gain at 1285 nm. On the other hand, when the current injection value is 6 mA, the gain at the 1220 mA is at a similar level to the gain at 1285 nm. When the current injection value is 9 mA or more, the gain at 1220 mA is larger than the gain at 1285 nm, and the difference between the gain at 1220 nm and the gain at 1285 nm increases as the current injection value increases.

Figure 4:
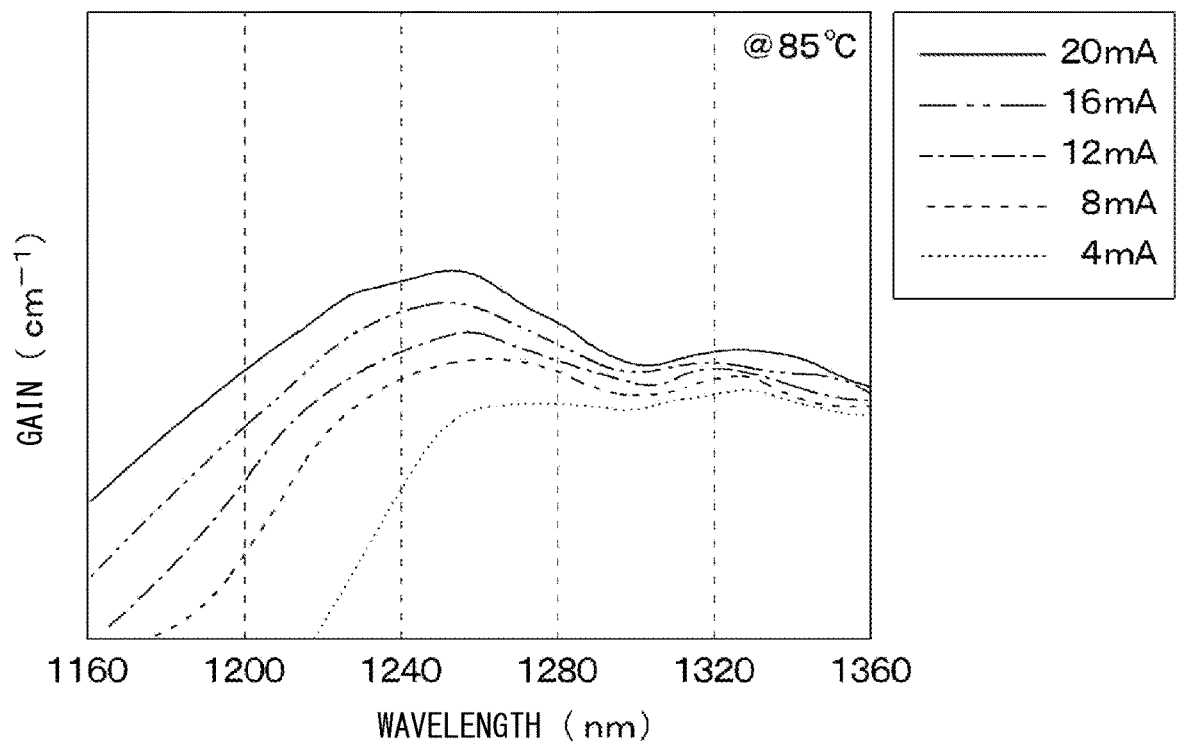
FIG. 4 is a graph showing changes in the gain spectra of the semiconductor device of the comparative example, when the current injection value is changed, at a high temperature.

In addition, in the semiconductor device of the comparative example, the gains in the wavelength band of 1160 nm to 1360 nm at 85° C. are smaller as a whole than those at 25° C. On the other hand, when the current injection value is increased in the range of 4 mA to 20 mA, it was observed that the gains at 85° C. have the similar tendency to those at 25° C. For example, in the semiconductor device of the comparative example, as shown in FIG. 4, when the current injection value is 4 mA at 85° C., the gain at 1250 nm is substantially at a similar level to the gain at 1320 nm. However, when the current injection value is 8 mA at 85° C., the gain at 1250 nm is slightly larger than the gain at 1320 nm. When the current injection value is 12 mA or larger, the gain at 1250 nm is much higher than the gain at 1320 nm, and the difference between the gain at 1250 nm and the gain at 1320 nm increases as the current injection value increases.

As described above, in the semiconductor device of the comparative example, the gain can be increased in the entire wavelength band in both of the case of the room temperature and the case of the high temperature by increasing the current injection value to a predetermined value or higher. However, the gain on the short wavelength side is relatively higher than the gain on the long wavelength side, impairing the smoothness of the gain spectrum.

Figure 5:
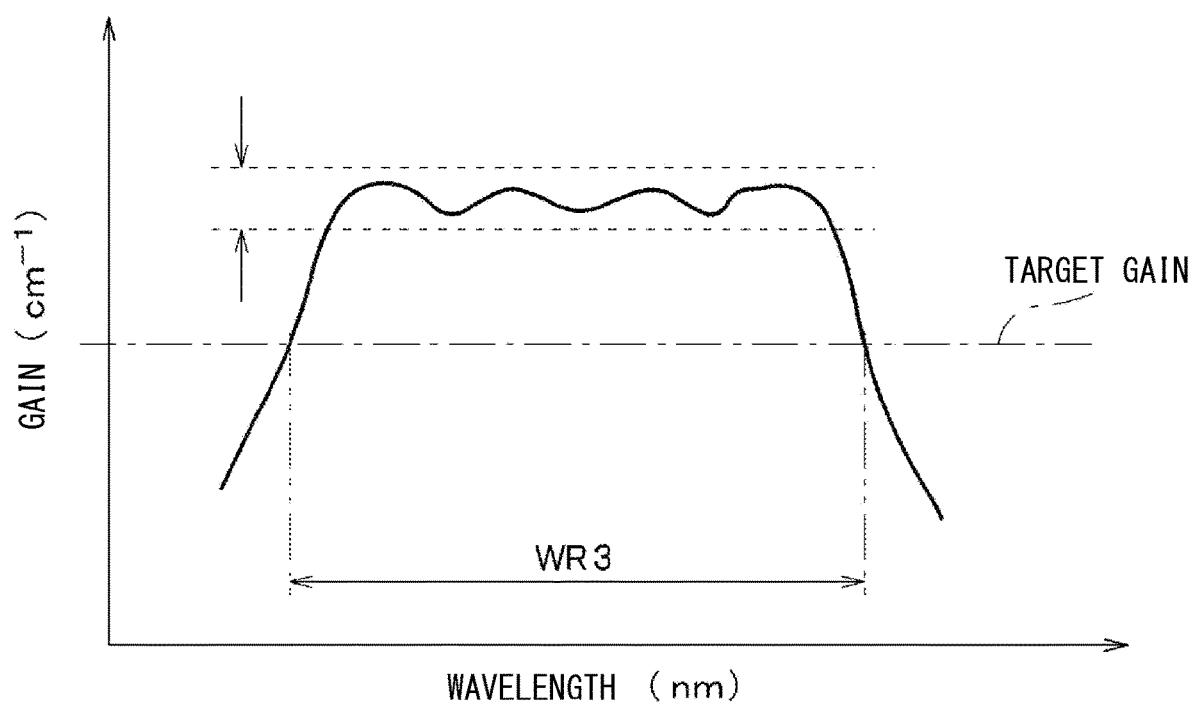
FIG. 5 is a diagram showing an example of a gain spectrum of the semiconductor device of the first embodiment, at a high temperature and a high current injection value.

In the semiconductor device 1 of the present embodiment, the quantum dot group 4 has the longest wavelength layer group. That is, the quantum dot group 4 of the present embodiment has two or more longest wavelength layers 5A that have the longest wavelength and the same central wavelength, so that the gain of the wavelength corresponding to the longest wavelength layers 5A can be obtained at a relatively high level in advance. In other words, in anticipation that the gain increase on the short wavelength side is greater than that on the long wavelength side, the semiconductor element 1 is configured such that the gain corresponding to the longest wavelength layer 5A is greater on the long wavelength side than that on the short wavelength side at the time of low current injection, and thus the smoothness of the gain at the time of high current injection can be secured. As a result, as shown in FIG. 5, for example, the semiconductor element 1 can ensure a wide wavelength band WR3 and achieve both the gain of the predetermined target level or higher and the flat gain at that time.

In the present embodiment, the quantum dot group 4 is configured so that the gain on the long wavelength side is increased to be relatively high by the longest wavelength layer group in advance. Thus, the semiconductor device 1 can obtain the gain of the predetermined level or higher in the wide wavelength band, that is, high output, as well as secure the smoothness of the gain, at the time of high current injection.

Second Embodiment

A semiconductor device 1 of a second embodiment will be described with reference to FIG. 6.

Figure 6:
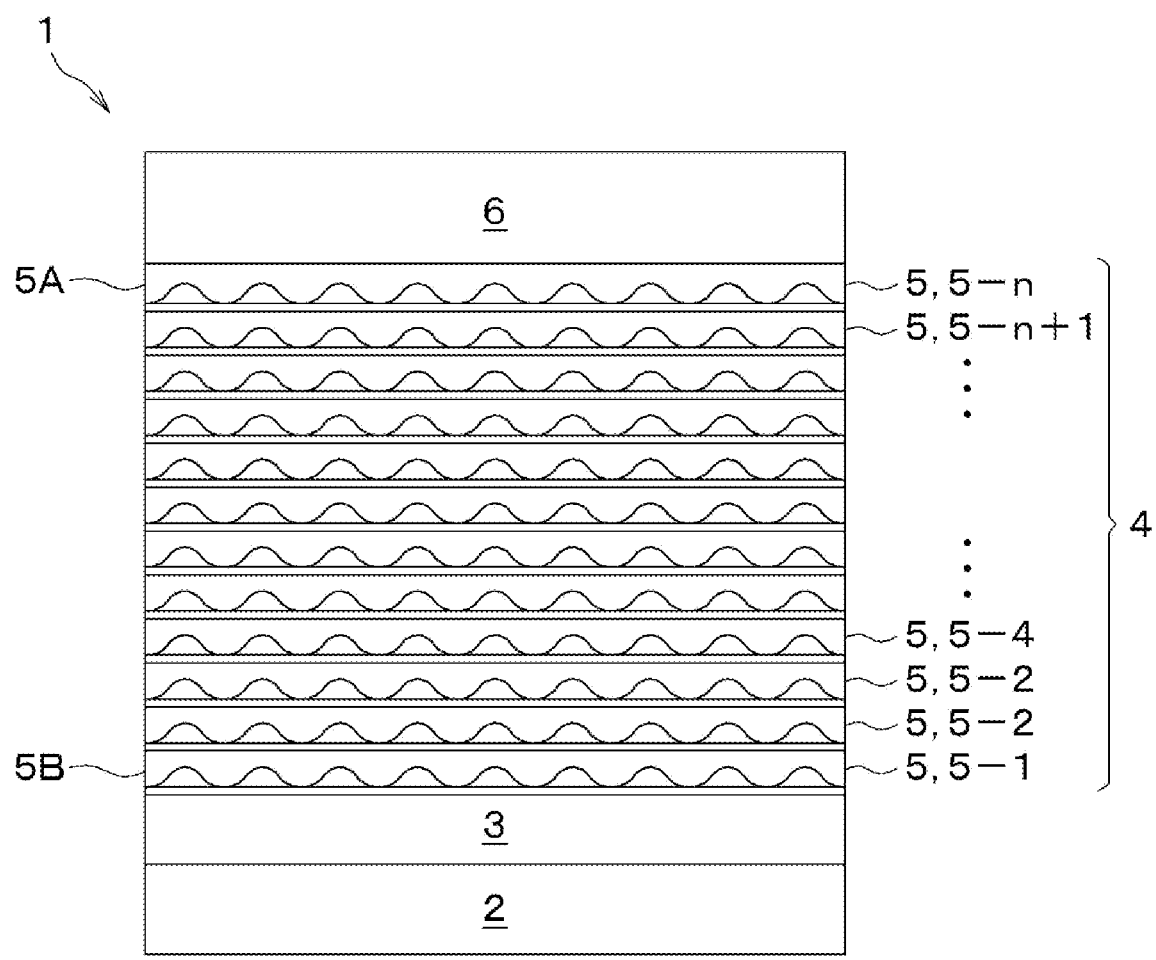
FIG. 6 is a cross-sectional view of a semiconductor device according to a second embodiment.

In the semiconductor device 1 of the present embodiment, for example, as shown in FIG. 6, the arrangement of the quantum dot group 4 is reversed from that of the first embodiment. That is, differently from the first embodiment, the longest wavelength layer 5A is arranged at the end on the p-cladding layer 6 side, and the shortest wavelength layer 5B is arranged at the end on the n-cladding layer 3 side. Hereinafter, the difference from the first embodiment will be mainly described.

In the quantum dot group 4 of the present embodiment, the arrangement direction of the plural quantum dot layers 5 is opposite to that of the first embodiment. In the quantum dot group 4, the first layer 5-1 at the end on the n-cladding layer 3 side is the shortest wavelength layer 5B, and the quantum dot layers 5 are stacked so that the central wavelength of each quantum dot layer 5 sequentially shifts to the long wavelength side along the stacking direction toward the n-th layer 5-$n$. In other words, the higher layer 5 has the longer central wavelength. Thus, in the quantum dot group 4, the n-th layer 5-$n$ is adjacent to the p-cladding layer 6, and is the longest wavelength layer 5A.

By arranging the quantum dot group 4 as described above, the longest wavelength layer 5A is located in an area closest to the p-cladding layer 6 that supplies holes having a larger effective mass and a smaller mobility than electrons. That is, in the quantum dot group 4, the quantity of holes supplied from the p-cladding layer 6 is higher in the quantum dot layer 5 closer to the longest wavelength layer 5A. As a result, the quantum dot group 4 is in a state where the gain on the longest wavelength layer 5A side is relatively larger than the gain on the shortest wavelength layer 5B side. Thus, at the time of high current injection, the gain in the wavelength band is equal to or higher than a predetermined level, as well as the gain is smoothed.

In the quantum dot group 4 of the present embodiment, all the quantum dot layers 5 have different central wavelengths at which the gains are the maximum. That is, the quantum dot group 4 does not include quantum dot layers 5 having the same central wavelength.

Also in the present embodiment, similar to the first embodiment, the semiconductor device 1 can achieve the effect of securing the gain of the predetermined level or higher in the wavelength band at the time of the high current injection, and achieve the effect of smoothing the gain.

Third Embodiment

A semiconductor device 1 of a third embodiment will be described with reference to FIG. 7.

Figure 7:
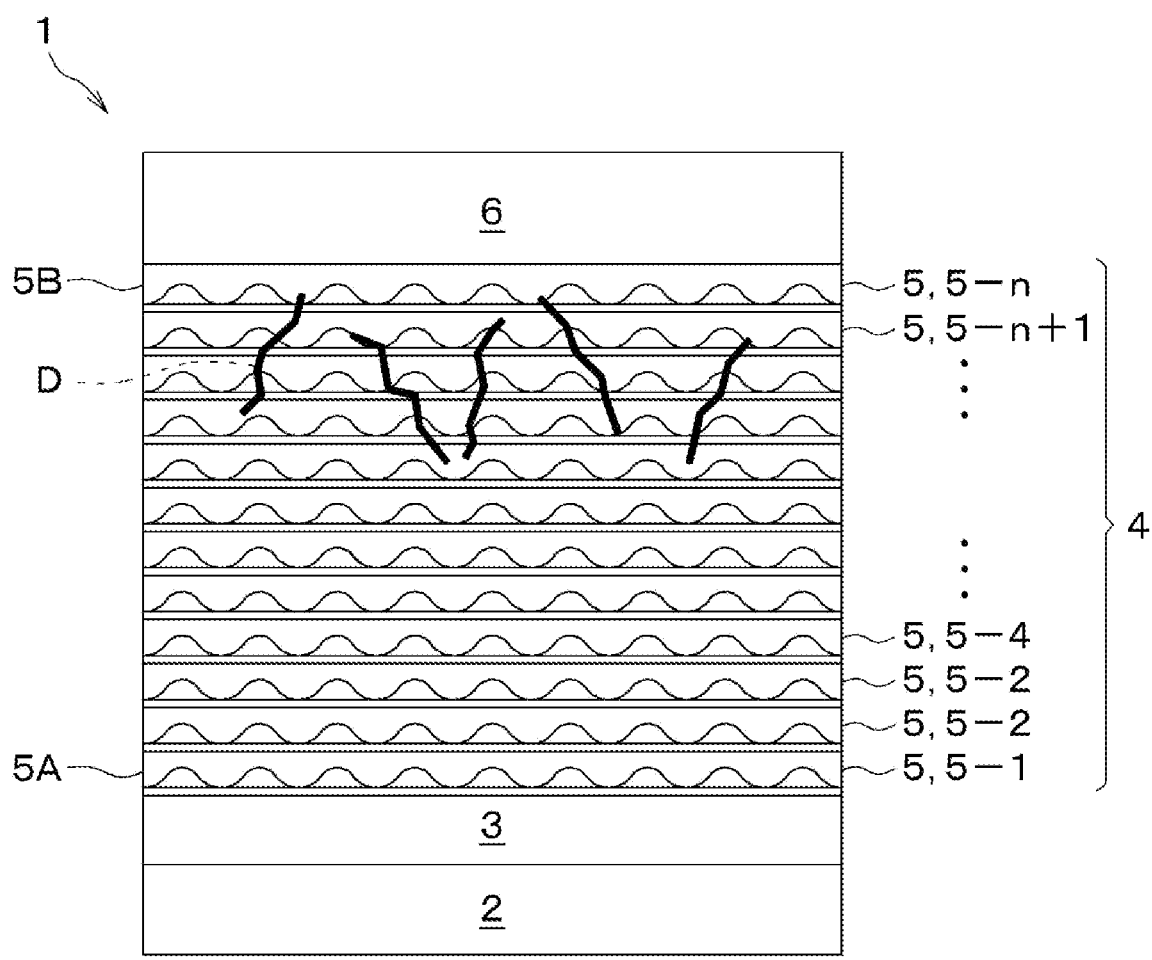
FIG. 7 is a cross-sectional view of a semiconductor device according to a third embodiment.

The semiconductor device 1 of the present embodiment is different from the first embodiment in that the quantum dot group 4 has a dislocation D in the quantum dot layers 5 near the p-cladding layer 6, for example, as shown in FIG. 7. Hereinafter, the difference from the first embodiment will be mainly described.

Similar to the first embodiment, the quantum dot group 4 has the configuration in which the first layer 5-1 at the end on the n-cladding layer 3 side is the longest wavelength layer 5A, and the n-th layer 5-$n$ at the opposite end is the shortest wavelength layer 5B. In the present embodiment, however, dislocations D are generated in a group of the quantum dot layers 5 on the shortest wavelength layer 5B side. That is, in the quantum dot group 4, for example, the shortest wavelength layer 5B or a group including the shortest wavelength layer 5B and at least one quantum dot layer 5 adjacent to the shortest wavelength layer 5B on the longest wavelength layer 5A side has the crystallinity lower than that of the other quantum dot layers 5 on the longest wavelength layer 5A side.

Hereinafter, for simplification of explanation, the group including the shortest wavelength layer 5B and at least one quantum dot layer 5 adjacent to the shortest wavelength layer 5B on the longest wavelength layer 5A side will be referred to as a "shortest wavelength layer group" for convenience.

In the present embodiment, the shortest wavelength layer group is arranged at a position farther from the semiconductor substrate 2, since the shortest wavelength layer group is stacked later than the longest wavelength layer group. In other words, the shortest wavelength layer group is located at a position farther from the semiconductor substrate 2 in the film formation process of the quantum dot group 4, that is, at a position where crystal growth strain in the quantum dot layers 5 is accumulated. As a result, the crystallinity of the shortest wavelength layer group is lower than that of the longest wavelength layer group. In the quantum dot group 4, therefore, the quantum dot layer 5 closer to the shortest wavelength layer 5B has more crystal defects and is in the state where dislocations D is more likely to occur. Thus, the gain of the quantum dot layer 5 closer to the shortest wavelength layer 5B is smaller, as compared to the gain of the quantum dot layer 5 closer to the longest wavelength layer 5A. As such, in the quantum dot group 4, the smoothness of the gain is achieved when the gain of the predetermined level or higher is secured in the wavelength band at the time of the high current injection.

In the quantum dot group 4 of the present embodiment, the central wavelength is different in each of the quantum dot layers 5. That is, the quantum dot group 4 does not have quantum dot layers 5 having the same central wavelength. In addition, the quantum dot group 4 has the stacked structure in which the central wavelength of quantum dots of the quantum dot layer 5 sequentially shifts to the short wavelength side toward the upper layer on the p-cladding layer 6 side. That is, in the stacked structure of the quantum dot group 4, the upper quantum dot layers 5 have the shorter central wavelengths. The quantum dot group 4 is configured to generate the dislocations D in the shortest wavelength layer group by setting the number "n" of the quantum dot layers 5 to a predetermined number or more. Although not limited, the number "n" is, for example, 20 or more.

Also in the present embodiment, similar to the first embodiment, the semiconductor device 1 can achieve the effect of securing the gain of a predetermined level or higher in the wavelength band at the time of the high current injection and the effect of smoothing the gain.

Fourth Embodiment

A semiconductor device 1 of a fourth embodiment will be described with reference to FIG. 8.

Figure 8:
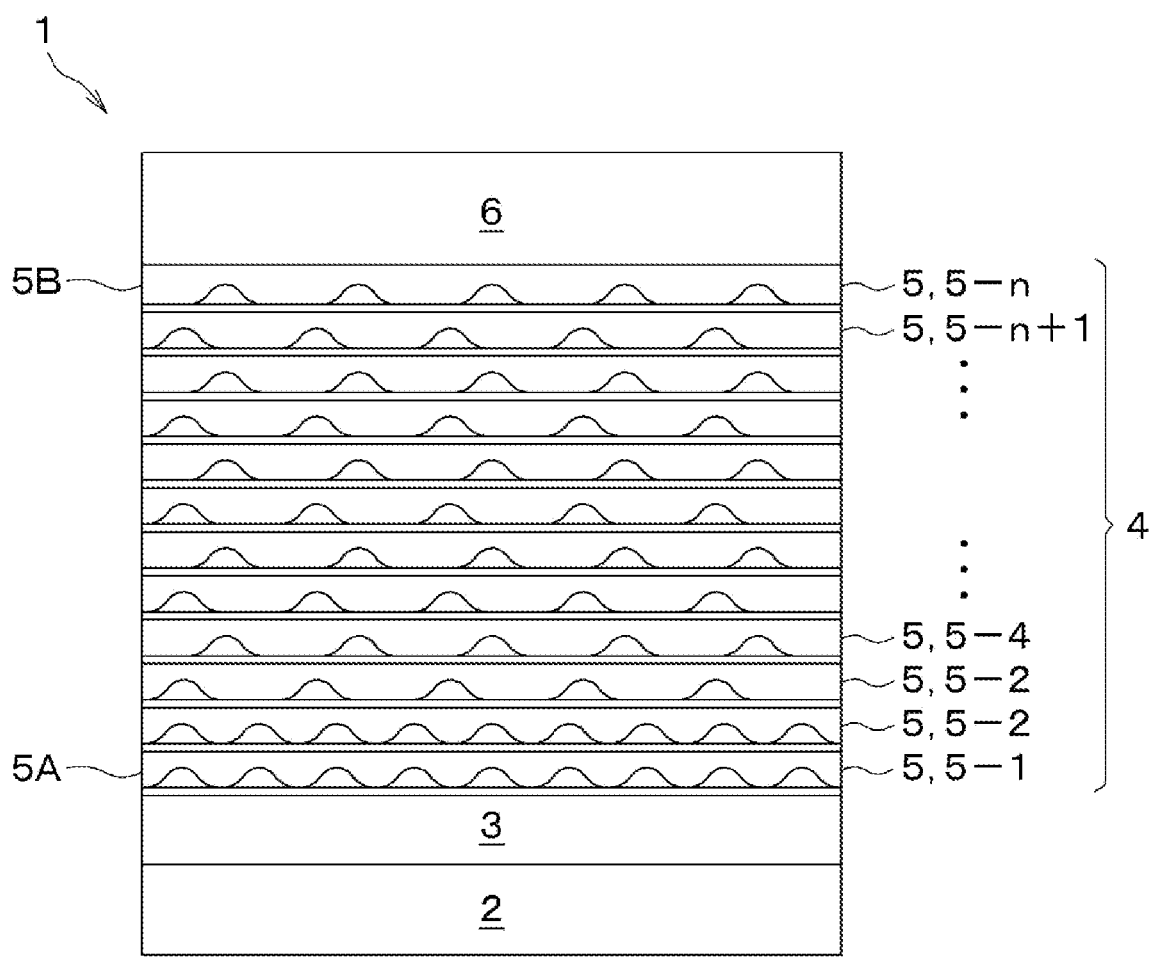
FIG. 8 is a cross-sectional view of a semiconductor device according to a fourth embodiment.

In the present embodiment, a semiconductor device 1 is different from the semiconductor device 1 of the first embodiment in that the quantum dot layer 5 closer to the shortest wavelength layer 5B has fewer quantum dots than the quantum dot layer 5 closer to the longest wavelength layer 5A, for example, as shown in FIG. 8. Hereinafter, the difference from the first embodiment will be mainly described.

In the quantum dot group 4 of the present embodiment, similar to the first embodiment, the first layer 5-1 at the end on the n-cladding layer 3 side is the longest wavelength layer 5A, and the n-th layer 5-$n$ at the end on the opposite side is the shortest wavelength layer 5B. Further, in the present embodiment, the quantum dot density is intentionally differentiated in the quantum dot layers 5. The term "quantum dot density" means the ratio of quantum dots occupying in one quantum dot layer 5.

In the quantum dot group 4 of the present embodiment, for example, the number of quantum dots in the longest wavelength layer 5A or the longest wavelength group is made larger than the number of quantum dots in the other quantum dot layers 5, so that the quantum dot density is relatively larger in the longest wavelength layer 5A or the longest wavelength group than in the other quantum dot layers 5. In other words, in the quantum dot group 4, similar to the first embodiment, the total volume of the quantum dots having the longest central wavelength is larger than the total volume of the quantum dots in each of the other quantum dot layers 5. As a result, in the quantum dot group 4, the gain is larger on the longest wavelength layer 5A side than that on the shortest wavelength layer 5B side. As a result, when the quantum dot layer group 4 secures the gain of the predetermined level or higher in the wavelength band at the time of the high current injection, the gain can be smoothed.

In the quantum dot group 4 of the present embodiment, the central wavelength achieving the maximum gain is different in all the quantum dot layers 5. Thus, the quantum dot group 4 does not have quantum dot layers 5 having the same central wavelength. In addition, the quantum dot group 4 has a stacked structure in which the central wavelength of the quantum dots in the quantum dot layer 5 sequentially shifts to the short wavelength side toward the upper layer on the p-cladding layer 6 side. That is, in the stacked structure of the quantum dot group 4, the upper layer has the shorter central wavelength.

Also in the present embodiment, similar to the first embodiment, the semiconductor device 1 can achieve the effect of securing the gain of the predetermined level or higher in the wavelength band and smoothing the gain, at the time of the high current injection.

Fifth Embodiment

A semiconductor device 1 of a fifth embodiment will be described with reference to FIG. 9.

Figure 9:
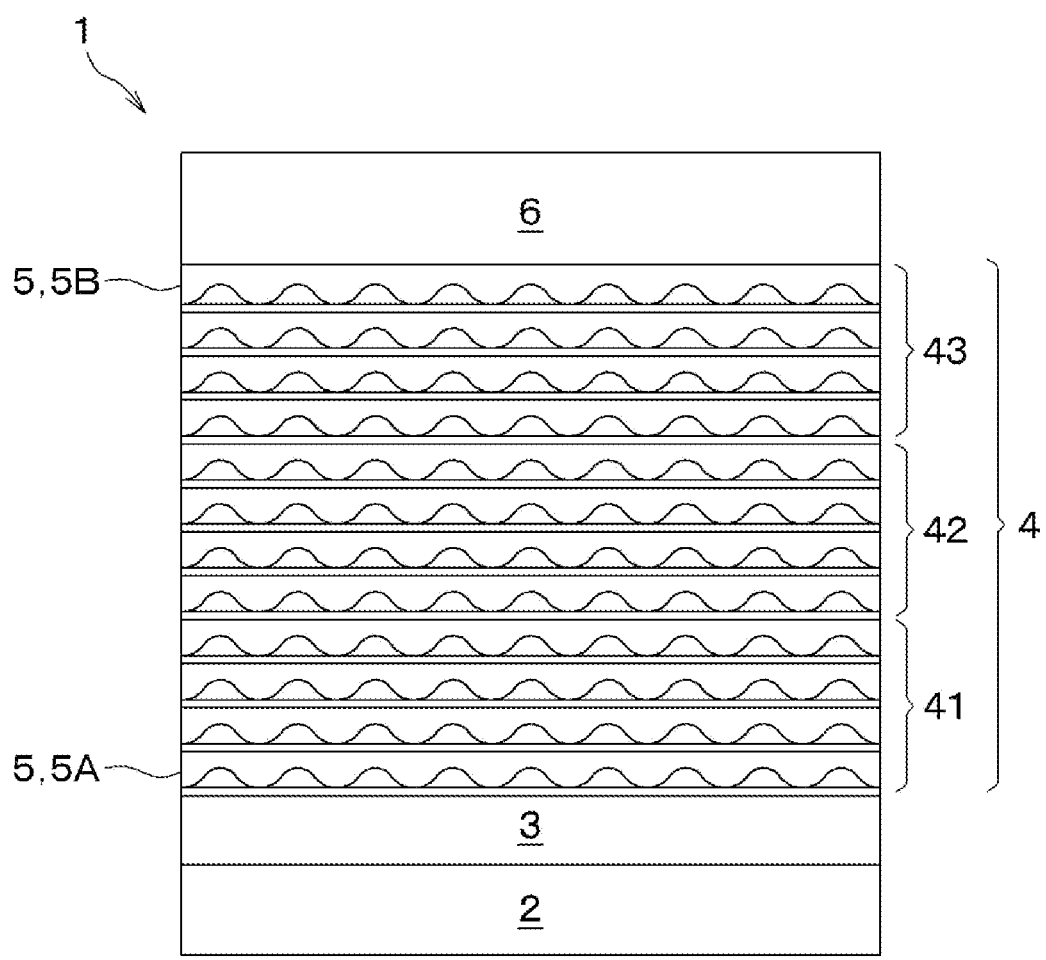
FIG. 9 is a cross-sectional view of a semiconductor device according to a fifth embodiment.

The semiconductor device 1 of the present embodiment is different from the first embodiment in that the quantum dot group 4 includes a first group 41 having relatively largest gain, a second group 42 having a second largest gain, and a third group 43 having a smallest gain, for example, as shown in FIG. 9. That is, the gain of the second group 42 is smaller than that of the first group 41, but is larger than that of the third group 43. Hereinafter, the difference from the first embodiment will be mainly described.

In the quantum dot group 4 of the present embodiment, similar to the first embodiment, the first layer 5-1 is the longest wavelength layer 5A and the n-th layer 5-$n$ is the shortest wavelength layer 5B. Further, the first group 41 is stacked on the n-cladding layer 3, the second group 42 is stacked on the first group 41, and the third group 43 is stacked on the second group. The first group 41, the second group 42 and the third group 43 each include multiple quantum dot layers 5, but the material and/or composition ratio is differentiated.

For example, in the first group 41, the quantum dots are made of InAs, and the gain at the central wavelength is relatively larger than that of the second group 42 and the third group 43.

For example, in the second group 42, the quantum dots are made of $In_{0.5}Ga_{0.5}As$, and the gain at the central wavelength is relatively smaller than that of the first group 41 and larger than that of the third group 43.

For example, in the third group 43, the quantum dots are made of $In_{0.75}Ga_{0.25}As$, and the gain at the central wavelength is the smallest, that is, smaller than that of the first group 41 and the second group 42.

That is, in the quantum dot group 4 of the present embodiment, the quantum dots are made of the materials or have the composition ratios so that the gain reduces towards the shortest wavelength layer 5B and increases toward the longest wavelength layer 5A.

In the first group 41, the second group 42 and the third group 43, the closer the quantum dot layer 5 is to the p-cladding layer 6, that is, the upper the quantum dot layer 5 is, the more the central wavelength shifts to the shorter wavelength side. In the quantum dot group 4 of the present embodiment, all the quantum dot layers 5 have different central wavelengths. The quantum dot group 4 does not have quantum dot layers 5 having the same central wavelength. The number of quantum dot layers 5 constituting each of the first group 41, the second group 42 and the third group 43 can be changed as appropriate.

Also in the present embodiment, similar to the first embodiment, the semiconductor device 1 can achieve the effect of securing the gain of the predetermined level or higher in the wavelength band and smoothing the gain, at the time of the high current injection.

Sixth Embodiment

Figure 11:
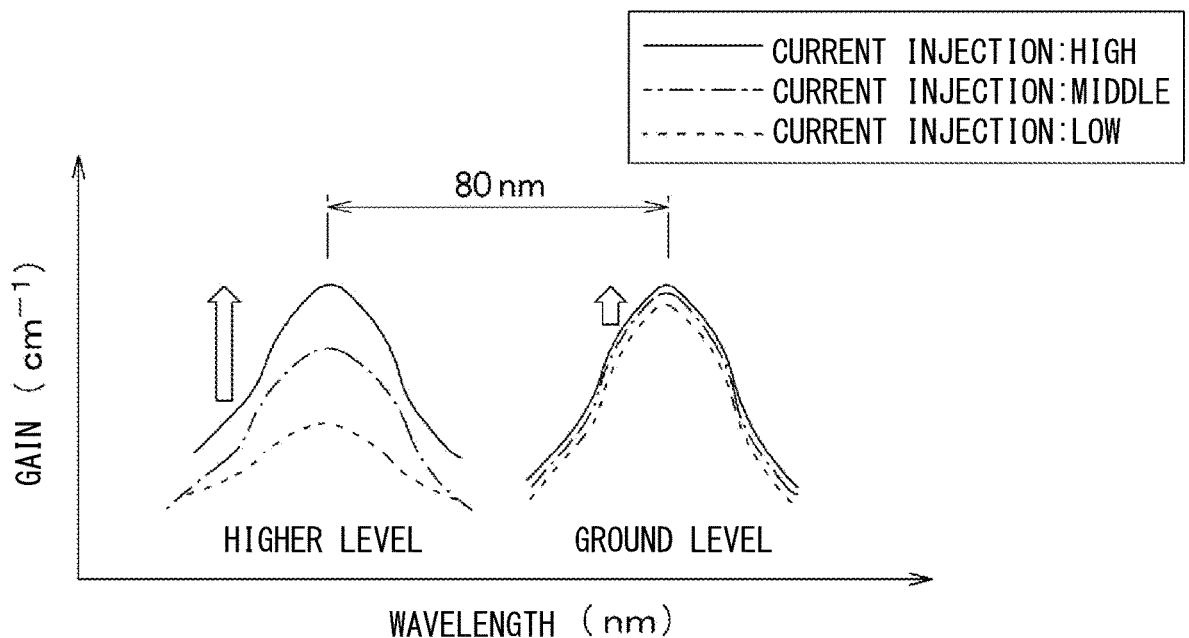
FIG. 11 is an explanatory diagram for explaining changes of the gains at a ground level and a higher level of a fourth quantum dot group with respect to respective current injection values in the sixth embodiment.
Figure 12:
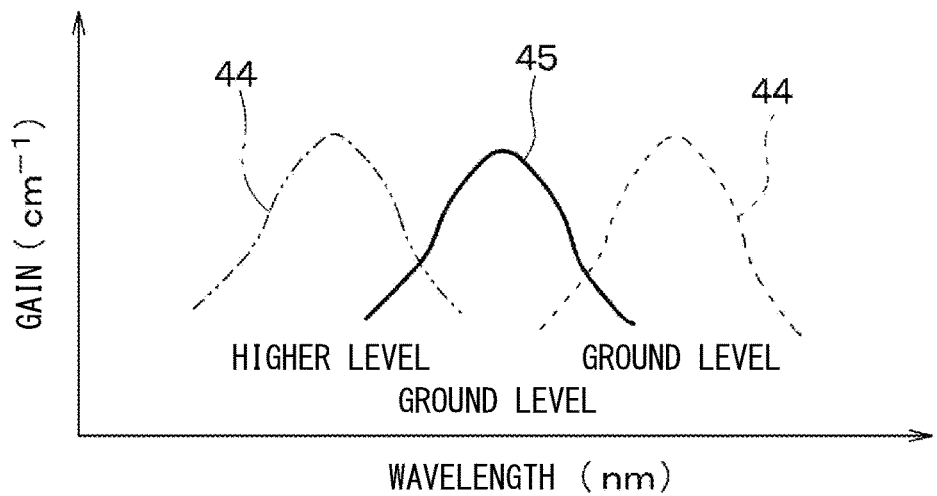
FIG. 12 is an explanatory diagram for explaining a relationship between the ground level and higher level of the fourth quantum dot group and the ground level of a fifth quantum dot group in the sixth embodiment.

A semiconductor device 1 of a sixth embodiment will be described with reference to FIGS. 10 to 12. In FIG. 11, open arrows indicate the direction of change in gain when the current injection value of the quantum dots of a fourth group 44, which will be described later, is increased. In FIG. 12, a solid thick line indicates the gain spectrum corresponding to the ground state of the quantum dots of a fifth group 45, which will be described later.

Figure 10:
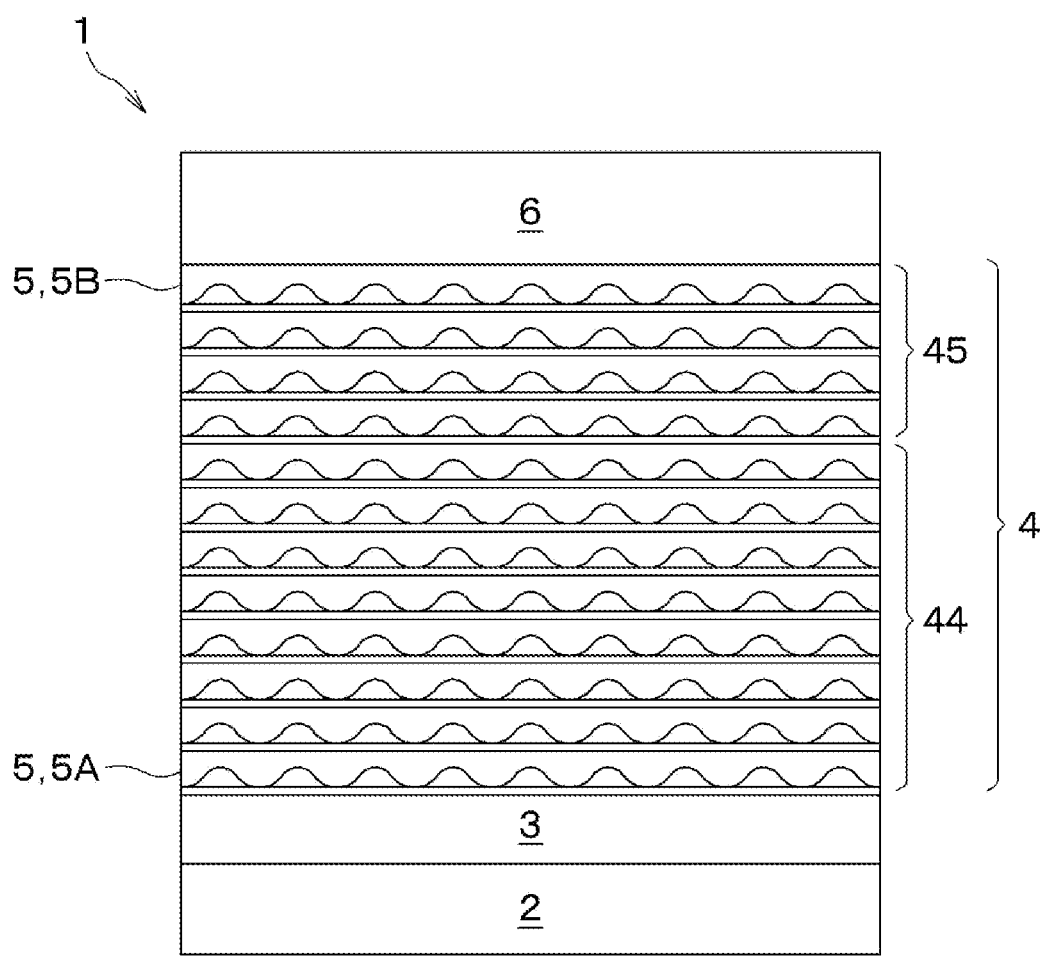
FIG. 10 is a cross-sectional view of a semiconductor device according to a sixth embodiment.

For example, as shown in FIG. 10, the semiconductor device 1 of the present embodiment is different from the semiconductor device 1 of the first embodiment in that the quantum dot group 4 includes a fourth group 44 utilizing the ground level and higher level of quantum dots and a fifth group 45 whose energy level is adjusted in consideration of the energy levels of the quantum dots of the fourth group 44. Hereinafter, the difference from the first embodiment will be mainly described.

Similar to the first embodiment, in the quantum dot group 4, the first layer 5-1 on the n-cladding layer 3 side is the longest wavelength layer 5A, and the n-th layer 5-$n$ on the p-cladding layer 6 side is the shortest wavelength layer 5B. In the present embodiment, further, the quantum dot group 4 has the fourth group 44 on the longest wavelength layer 5A side, and the fifth group 45 on the shortest wavelength layer 5B side.

The fourth group 44 is, for example, a group composed of plural quantum dot layers 5 having the quantum dots made of InAs. The fourth group 44 is adjusted so as to achieve the gain at the wavelength corresponding to the ground level of the quantum dots as well as the gain at the wavelength corresponding to a higher energy level next to the ground level at the time of high current injection. Hereinafter, for simplification of explanation, the higher energy level that is high next to the ground level is simply referred to as a "higher level".

Specifically, when the quantum dots of the fourth group 44 are made of InAs, in the fourth group 44, the wavelength that achieves the gain of the higher level is shifted to the short wavelength side by about 80 nm relative to the wavelength that achieves the gain of the ground level of the quantum dots of each quantum dot layer 5, for example, as shown in FIG. 11. Further, in the fourth group 44, when the current injection value is increased, the increase in gain at the wavelength corresponding to the higher level is greater than the increase in gain at the wavelength corresponding to the ground level. In the fourth group 44 and the fifth group 45, the wavelength corresponding to the ground level sequentially shifts to the short wavelength side toward the upper layer, and the ground level of the quantum dots of an upper quantum dot layer 5 is different from the higher level of the quantum dots of a lower quantum dot layer 5 located below. Note that the difference between the wavelength corresponding to the ground level of the quantum dots of each quantum dot layer 5 and the wavelength corresponding to the higher level of the quantum dots of each quantum dot layer 5 varies depending on the material and the composition ratio of the quantum dots. For example, the difference is in the range between 60 nm and 100 nm.

In the quantum dots of each of the quantum dot layers 5, when the current injection value is increased and the electrons at the ground level are all excited, the electrons at the next higher energy level are subsequently excited. At this time, for example, if the ground level of the quantum dots of the quantum dot layer 5 located above the longest wavelength layer 5A is substantially the same as the higher level of the quantum dots of the longest wavelength layer 5A, the electrons at the ground level of the upper layer and the electrons at the higher level of the lower layer are both in the excited states. That is, since the wavelength corresponding to the higher level of the quantum dots in the lower layer and the wavelength corresponding to the ground level of the quantum dots in the upper layer are substantially the same, the gain at that wavelength is much larger than the gain of other wavelengths. As a result, there is a fear that the smoothness of the gain will be impaired. In order to avoid such a situation, in the quantum dot group 4, as described above, the ground level of the quantum dots of each quantum dot layer 5 is different from the higher level of the quantum dots of another layer.

The ground level of the quantum dots of each quantum dot layer 5 can be adjusted, for example, by controlling the dimensions and density of the quantum dots and changing the composition ratio of the cap while making the quantum dots with a predetermined composition ratio in the fourth group 44 and the fifth group 45.

The fifth group 45 is composed of the multiple quantum dot layers 5 having the quantum dots made of $In_{0.5}Ga_{0.5}As$, for example. In the fifth group 45, for example, as shown in FIG. 12, the ground level of the quantum dots is adjusted to be the level between the ground level and the higher level of the quantum dots of the fourth group 44. As a result, the fifth group 45 can achieve the gain at the wavelength positioned between the ground level and the higher level of the quantum dots of the fourth group 44, and achieve the effect of smoothing the maximum gain in the wavelength band at the time of high current injection.

Since there is an efficient optimal value for the total number of quantum dot layers of the quantum dot group 4, even if the number of layers is merely increased, the efficiency will not be increased and thus the gain, that is, the output of the quantum dot group 4 cannot be increased. Therefore, the quantum dot group 4 needs to be adjusted, in the limited total number of layers, to achieve the high output and the smoothness of the gain at the time of the high current injection. In the quantum dot group 4 of the present embodiment as described above, therefore, the ground level of the quantum dots of the upper quantum dot layer 5 is at the energy level that is different from the higher level of the quantum dots of the lower quantum dot layer 5 located below. Further, the ground level of the quantum dots of the fifth group 45 is set between the ground level and the next higher level of the quantum dots of the fourth group 44. Therefore, the quantum dot group 4 can achieve the gain at the wavelength corresponding to the level between these levels, and the gain can be smoothed.

Also in the present embodiment, similar to the first embodiment, the semiconductor device 1 can achieve the effect of securing the gain of the predetermined level or higher in the wavelength band and smoothing the gain at the time of the high current injection. In addition, in the present embodiment, even with a limited total number of quantum dot layers 5, it is possible to achieve both high output and smoothing of the gain at the time of the high current injection.

Other Embodiments

Although the present disclosure has been described in accordance with the embodiments, it is understood that the present disclosure is not limited to such embodiments and structures. The present disclosure encompasses various modifications and variations within the scope of equivalents. In addition, various combinations and modes, and other combinations and modes including only one element, more elements, or less elements are also within the scope and idea of the present disclosure. For example, the semiconductor device 1 can be configured by freely combining the constituent elements of the embodiments described above, except for those that are clearly incompatible.

The constituent element(s) of each of the above embodiments is/are not necessarily essential unless it is specifically stated that the constituent element(s) is/are essential in the above embodiment, or unless the constituent element(s) is/are obviously essential in principle. A quantity, a value, an amount, a range, or the like referred to in the description of the embodiments described above is not necessarily limited to such a specific value, amount, range or the like unless it is specifically described as essential or understood as being essential in principle. In each of the embodiments described above, when the shape of an element or the positional relationship between elements is mentioned, the present disclosure is not limited to such a specific shape or positional relationship unless otherwise particularly specified or unless the present disclosure is limited to the specific shape or positional relationship in principle.

What is claimed is:

1. A semiconductor device comprising:
a quantum dot group including a plurality of quantum dot layers stacked in a stacking direction, the plurality of quantum dot layers having different wavelengths at which respective gains are maximum, a part of or all of the plurality of quantum dot layers being stacked so that the different wavelengths sequentially shift along the stacking direction, wherein of the plurality of quantum dot layers, a quantum dot layer having a longest wavelength, as its wavelength, is referred to as a longest wavelength layer, and a quantum dot layer having a shortest wavelength, as its wavelength, is referred to as a shortest wavelength layer, the quantum dot group includes a longest wavelength layer group composed of some quantum dot layers including the longest wavelength layer and at least one quantum dot layer stacked on the longest wavelength layer toward the shortest wavelength layer, the quantum dot layers of the longest wavelength layer group have the same wavelength, a gain of the longest wavelength layer or the longest wavelength layer group at its wavelength is larger than a gain of each of the other quantum dot layers at respective wavelengths of each of the other quantum dot layers, the semiconductor device further comprises a semiconductor substrate, the plurality of quantum dot layers of the quantum dot group have a plurality of quantum dots and are stacked on the semiconductor substrate, the longest wavelength layer is disposed in an end layer of the quantum dot group closest to the semiconductor substrate, and a total volume of the quantum dots of the longest wavelength layer or a total volume of the quantum dots of the longest wavelength layer group is larger than a total volume of the quantum dots of each of the other quantum dot layers.

2. The semiconductor device according to claim 1, wherein
the plurality of quantum dots are crystal grown dots having strain, and
the plurality of quantum dot layers have different emission wavelengths.

3. The semiconductor device according to claim 2, wherein
the plurality of quantum dots are made of different constituent materials or different composition ratios of the constituent materials between the plurality of quantum dot layers, so that the plurality of quantum dot layers have different lattice constants.

4. The semiconductor device according to claim 3, wherein
the plurality of quantum dots are made of InAs or $In_xGa_{(1-x)}As$ ($0<x<1$).

5. The semiconductor device according to claim 1, wherein
a density of the quantum dots in the longest wavelength layer or a density of the quantum dots in each quantum dot layer of the longest wavelength layer group is higher than a density of the quantum dots in each of the other quantum dot layers.

6. An in-vehicle semiconductor optical amplifier that is used at a current injection value equal to or higher than a predetermined in-vehicle usage value, comprising:
a quantum dot group including a plurality of quantum dot layers stacked in a stacking direction, the plurality of quantum dot layers having different wavelengths at which respective gains are maximum, a part of or all of the plurality of quantum dot layers being stacked so that the different wavelengths sequentially shift along the stacking direction, wherein of the plurality of quantum dot layers, a quantum dot layer having a longest wavelength, as its wavelength, is referred to as a longest wavelength layer, and a quantum dot layer having a shortest wavelength, as its wavelength, is referred to as a shortest wavelength layer, the quantum dot group includes a longest wavelength layer group composed of some quantum dot layers including the longest wavelength layer and at least one quantum dot layer stacked on the longest wavelength layer toward the shortest wavelength layer, the quantum dot layers of the longest wavelength layer group have the same wavelength, and the quantum dot group is configured such that, in a state where the current injection value is lower than the predetermined in-vehicle usage value, a maximum gain of the longest wavelength layer or the longest wavelength layer group is larger than a maximum gain of each of the other quantum dot layers, such that a flat gain is at a level higher than a predetermined target level in a wavelength band when the current injection value is equal to or higher than the predetermined in-vehicle usage value.

* * * * *